(12) United States Patent
Merlet et al.

(10) Patent No.: US 9,363,917 B2
(45) Date of Patent: Jun. 7, 2016

(54) ELECTRICAL PACK WITH SEPARATE CONTROL AND POWER MODULES

(75) Inventors: Etienne Merlet, Paris (FR); Jean-Eric Besold, Saclay (FR); Marie-Noëlle Besold-Etchechoury, legal representative, Palaiseau (FR)

(73) Assignee: SAGEM DEFENSE SECURITE, Paris (FR)

( * ) Notice: Subject to any disclaimer, the term of this patent is extended or adjusted under 35 U.S.C. 154(b) by 107 days.

(21) Appl. No.: 13/142,215

(22) PCT Filed: Dec. 21, 2009

(86) PCT No.: PCT/FR2009/001466
§ 371 (c)(1),
(2), (4) Date: Jul. 20, 2011

(87) PCT Pub. No.: WO2010/072918
PCT Pub. Date: Jul. 1, 2010

(65) Prior Publication Data
US 2012/0020030 A1     Jan. 26, 2012

(30) Foreign Application Priority Data
Dec. 24, 2008  (FR) ..................................... 08 07454

(51) Int. Cl.
*H05K 7/14*     (2006.01)
*G06F 1/16*     (2006.01)
*H05K 7/10*     (2006.01)
*H05K 7/20*     (2006.01)

(52) U.S. Cl.
CPC .. *H05K 7/14* (2013.01); *G06F 1/16* (2013.01); *H05K 7/10* (2013.01); *H05K 7/1432* (2013.01); *H05K 7/20* (2013.01)

(58) Field of Classification Search
CPC .............. H05H 7/20; G06F 1/16; H05K 7/10; H05K 7/14; H05K 7/20
USPC .......... 361/799, 796, 686, 684, 737; 439/625, 439/629, 636
See application file for complete search history.

(56) References Cited

U.S. PATENT DOCUMENTS

| 5,619,111 | A   |   | 4/1997  | Katagiri                   |
|-----------|-----|---|---------|----------------------------|
| 5,710,693 | A   | * | 1/1998  | Tsukada et al. .......... 361/679.32 |
| 6,661,659 | B2  | * | 12/2003 | Tamba et al. ................. 361/699 |
| 2001/0017766 | A1 | * | 8/2001 | Murowaki et al. ............ 361/752 |
| 2006/0238975 | A1 | * | 10/2006 | Lin .............................. 361/697 |
| 2008/0007919 | A1 |   | 1/2008 | Isomoto                    |

FOREIGN PATENT DOCUMENTS

FR         2 782 597     2/2000

* cited by examiner

*Primary Examiner* — Courtney Smith
*Assistant Examiner* — Zhengfu Feng
(74) *Attorney, Agent, or Firm* — Muncy, Geissler, Olds & Lowe, P.C.

(57) ABSTRACT

An electrical housing includes power components grouped together in power modules and control components grouped together in a control module that is separate from the power modules.

13 Claims, 4 Drawing Sheets

ELECTRICAL PACK WITH SEPARATE CONTROL AND POWER MODULES

The present invention relates to an electrical pack, and more particularly although not exclusively, to a pack of circuit-breaker modules.

BACKGROUND OF THE INVENTION

Given the increasing use of electrical controls in vehicles, whether land vehicles or aircraft, it is now common practice to equip such vehicles with electrical housings that group together electromagnetic elements and electrical packs containing power components. In order to facilitate maintenance of the electrical housing, the components are generally grouped together in power modules, each comprising power components and control components carried by strips that are fastened on a support plate. The electromagnetic elements and the power components are connected to power supply buses carried by the support plate and to connection buses for connection with the control components.

It is thus possible to have modules that are identical, thereby making it easier to provide the electrical housing. Nevertheless, the control components are subjected to heating as a result of being close to the electromagnetic elements and to the power components, such that the reliability of the module suffers, in particular because of the greater temperature rise that occurs inside an electrical housing when the electrical housing is mounted on board an airplane designed to fly at high altitudes where the air is rarefied, or indeed as a result of a failure of a ventilation device that is usually associated with the electrical housing.

OBJECT OF THE INVENTION

An object of the invention is to propose an electrical pack that presents improved reliability.

SUMMARY OF THE INVENTION

In order to achieve this object, the invention provides an electrical pack comprising power components and control components distributed in modules, wherein the power components are grouped together in at least one power module while the control components are grouped together in at least one control module that is separate from said at least one power module.

The term "separate" is used to mean that the power modules are not directly in contact with the control modules.

Thus, heating of the control components by convection or by radiation as a result of heating of the power components is minimized.

In an advantageous version of the invention, each power module includes a support plate made of a metal that is a good conductor of heat and associated with an insulating component carrier plate carrying power components and electrical connection circuits of the power components, the component carrier plate being spaced apart from the support plate. Thus, a stream of air is established between the component carrier plate and the support plate such that the support plate is thermally associated with the component carrier plate and therefore serves as a cooling radiator for the power components.

In a preferred embodiment, the power modules include intermediate plates in the form of frames made of a metal that is a good conductor of heat and serving to provide mechanical and thermal connections between the component carrier plate and adjacent support plate. The intermediate plates thus encourage establishing a stream of air along the component carrier plate and by conduction they convey to the support plates the heat given off by radiation from the power components. In addition, the intermediate plates form obstacles preventing a tool being inserted between the component carrier plate and the support plate until the module has been removed.

In a preferred embodiment, the intermediate plate of a power module forms an obstacle preventing access to the fastener tabs of the preceding power module, thereby providing keying relative to the electrical housing receiving the electrical pack so that the right number of power modules are necessarily put into place.

According to another advantageous aspect of the invention, each control module includes a support plate made of a metal that is a good conductor of heat and that is associated with an insulating component carrier plate carrying control components and electrical connection circuits, the component carrier plate being spaced apart from the support plate. Thus, the control module is protected by the support plate against heating coming from an adjacent power module. The support plate also acts as an electromagnetic shield.

Preferably, each control module includes a perforated cover made of a metal that is a good conductor of heat, having an edge that surrounds the control component carrier plate. The cover serves simultaneously to establish a stream of cooling air by convection and to provide thermal and electromagnetic protection for the control components.

The electrical pack in an embodiment of the invention has a plurality of power modules, in particular mutually identical modules, and one control module.

The electrical pack in an embodiment of the invention comprises a set of power and control modules that are arranged in a stack in which the last module, at one of its ends, is the or one of the control modules (depending on whether there is only one control module or a plurality of control modules in the stack).

BRIEF DESCRIPTION OF THE DRAWINGS

Other characteristics and advantages of the invention appear on reading the following description of a preferred and non-limiting embodiment of the electrical housing of the invention, with reference to the accompanying figures, in which.

DETAILED DESCRIPTION OF THE INVENTION

Figure 1:
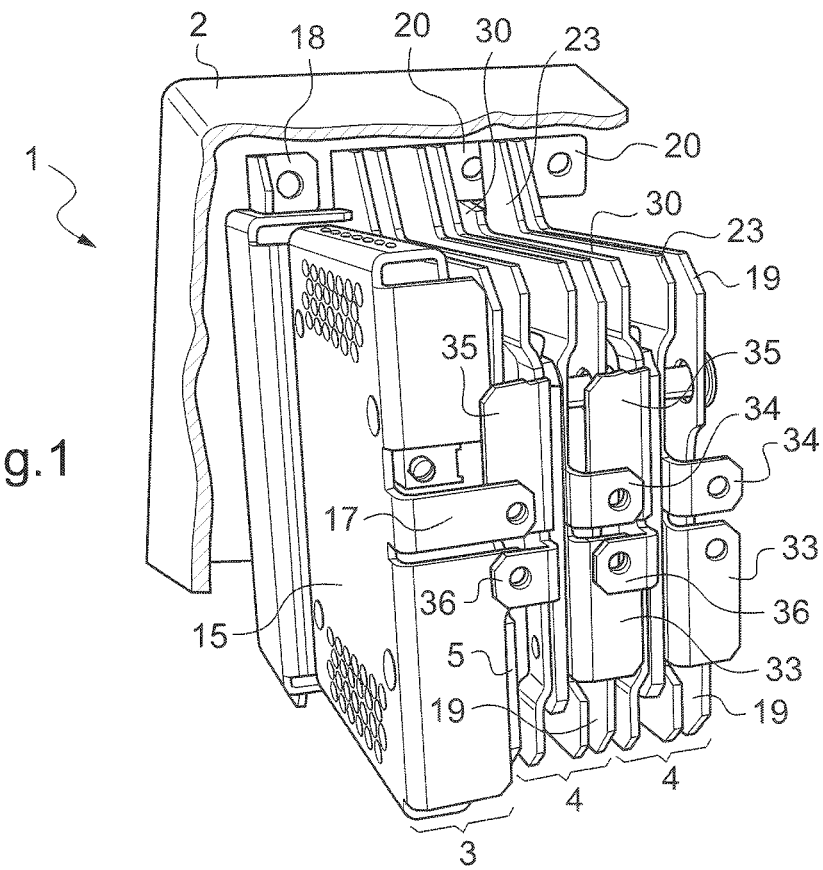
FIG. 1 is a perspective view of a group of modules comprising one control module and two power modules.
Figure 5:
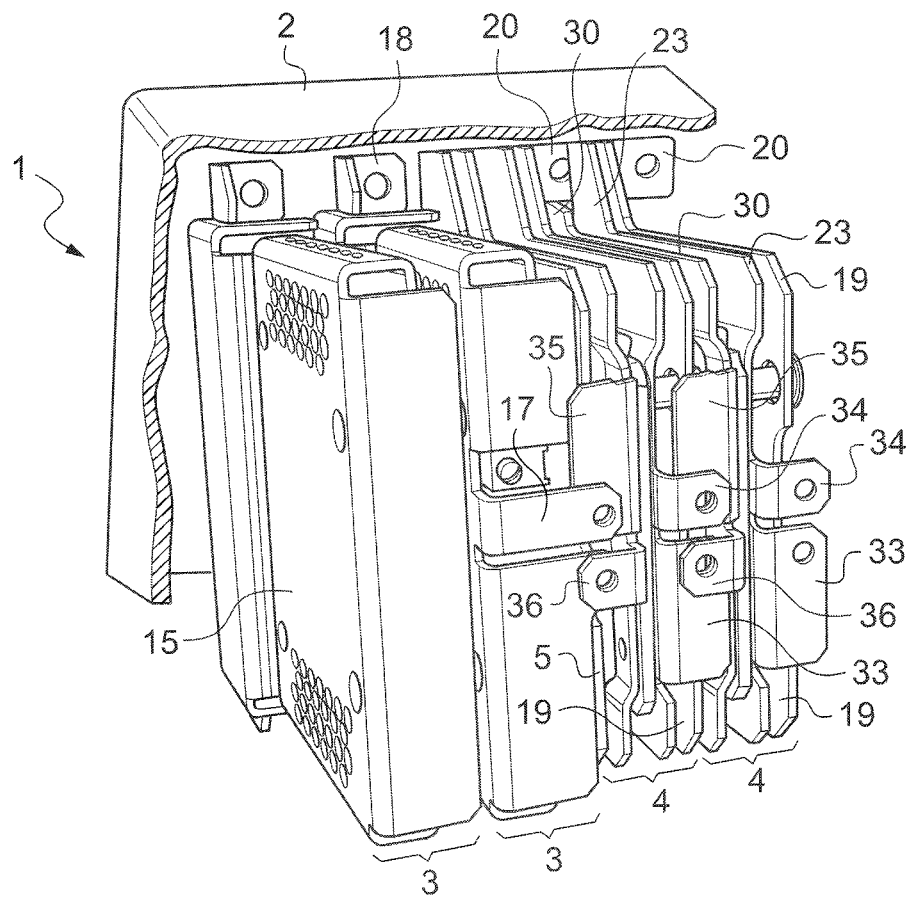
FIG. 5 is a perspective view of a group of modules comprising two control module and two power modules.

With reference to FIG. 1, the electrical housing given overall reference 1 comprises an outer casing 2 fitted with support rails (not shown) having groups of modules fastened thereto, which modules are referred to as electrical packs. FIG. 1 shows an electrical pack comprising one control module 3 and two power modules 4. FIG. 5 shows an electrical pack comprising a plurality (i.e., two) of control modules.

Figure 3:
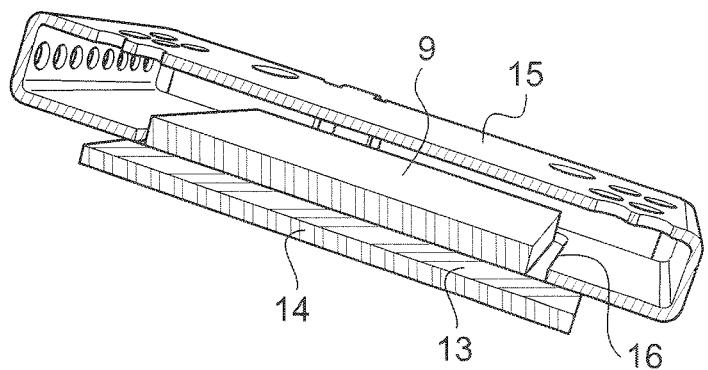
FIG. 3 is a section view on line III-III of FIG. 2 of the control component carrier plate together with the associated perforated cover.
Figure 2:
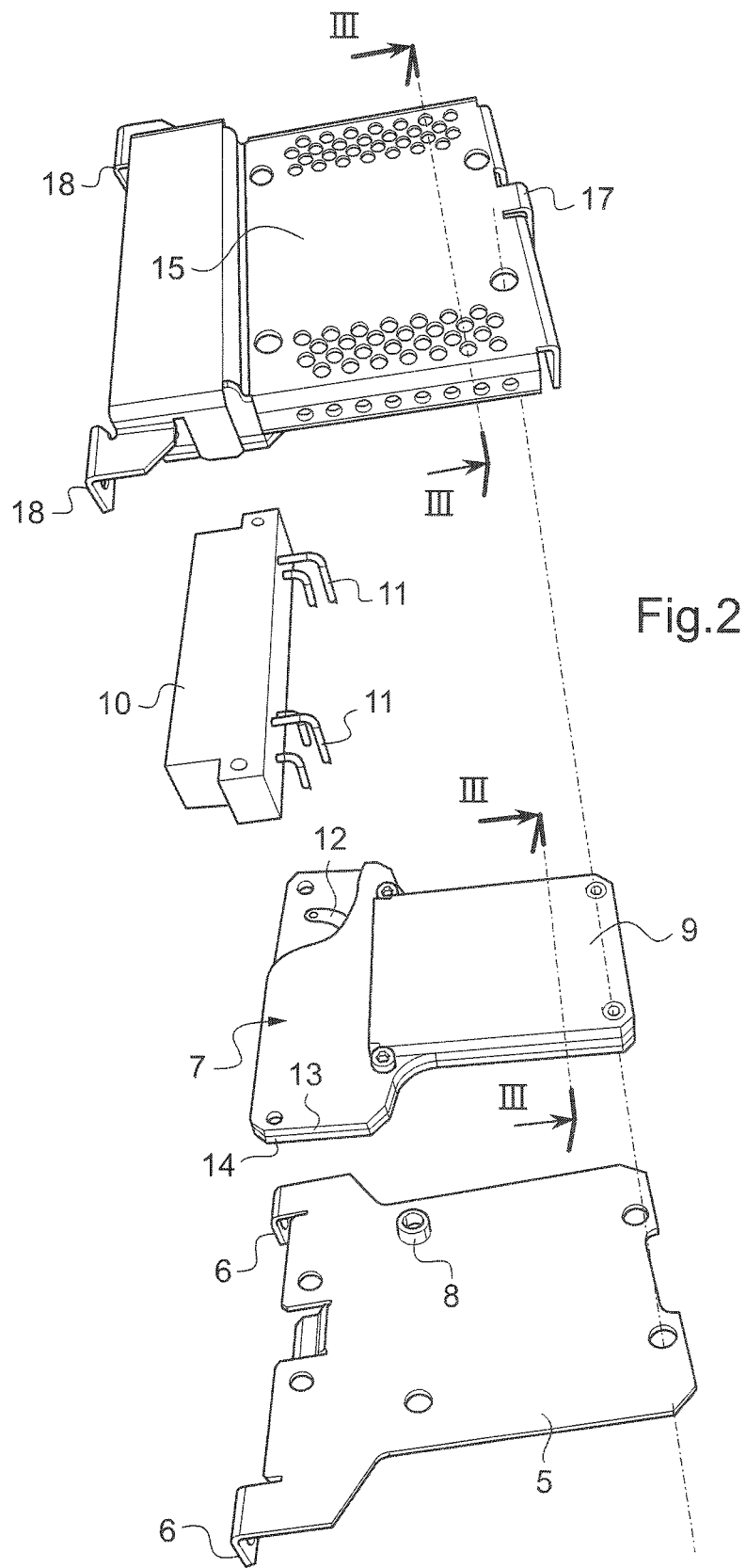
FIG. 2 is an exploded diagrammatic perspective view of the control module.

As shown in FIGS. 2 and 3, the control module comprises a support plate 5 of a metal that is a good conductor of heat, e.g. a plate made of aluminum, and including on its rear edge folded tabs 6 serving to fasten the support plate on a support rail. A control component carrier plate 7 is fastened to the support plate 5 via spacers 8, only one of which is visible in FIG. 2. On a face opposite from the support plate 5, the component carrier plate 7 includes a control component 9 (itself possibly being made up of a plurality of discrete components) that is fitted with a connector 10 connected by conductors 11 to a connection circuit 12 sandwiched between two insulating plates 13 and 14 forming the component carrier plate 7.

A perforated cover 15 of a metal that is a good conductor of heat is mounted on the component carrier plate 7 and includes an edge 16 that surrounds the control component 9. The module is held in an assembled configuration by studs (not shown) passing through holes in the support plate 5, of the component carrier plate 7, and of the cover 15, as represented by a chain-dotted line in FIG. 2. The cover 15 is also fitted on its front face with a tab 17 serving to fasten it to the immediately adjacent power module. On its rear edge, the cover 15 includes fastener tabs 18 for fastening to the support rails of the electrical housing.

Each power module 4 has a support plate 19 identical to the support plate 5 of the control module. In particular, the support plate 19 includes fastener tabs 20 for easy mounting on pre-drilled strips of the housing. The support 19 also includes an assembly tab 21 for a purpose that is described below. Spacers 22 are arranged to maintain spacing between the support plate 19 and an intermediate plate 23 made of a metal that is a good conductor of heat and that is in the shape of a frame, having one of its sides 24 curved perpendicularly to the plane of the plate 23 so that the central portion 25 is in contact with the support plate 19 when the intermediate plate 23 is held pressed against the spacers 22. A component carrier plate 26 is mounted to bear against the intermediate plate 23. The component carrier plate 26 includes power components 27 that are connected by connection circuits 28 to connection tabs 29 projecting along the rear edge of the component carrier plate 26.

The power module also includes a second intermediate plate 30 of structure that is strictly identical to that of the intermediate plate 23, and mounted symmetrically relative to the component carrier plate 26. During assembly of a group of modules, the intermediate plate 30 comes into contact with the support plate of the immediately adjacent module, the projecting central portion 31 of the rear side being engaged under the engagement tab 21 of the corresponding support plate of the immediately adjacent module. Furthermore, in order to enable the modules to be assembled to one another via their front faces, the intermediate plate 23 includes an assembly tab 33 that, during assembly, is covered by a corresponding assembly tab 36 of the intermediate plate 30 of the adjacent module, and the intermediate plate 23 includes an assembly tab 34 that covers the corresponding assembly tab 35 of the intermediate plate 30 of the adjacent module, as shown in FIG. 1. The assembly tab 17 of the control module is assembled to the assembly tab 36 of the adjacent power module.

Figure 4:
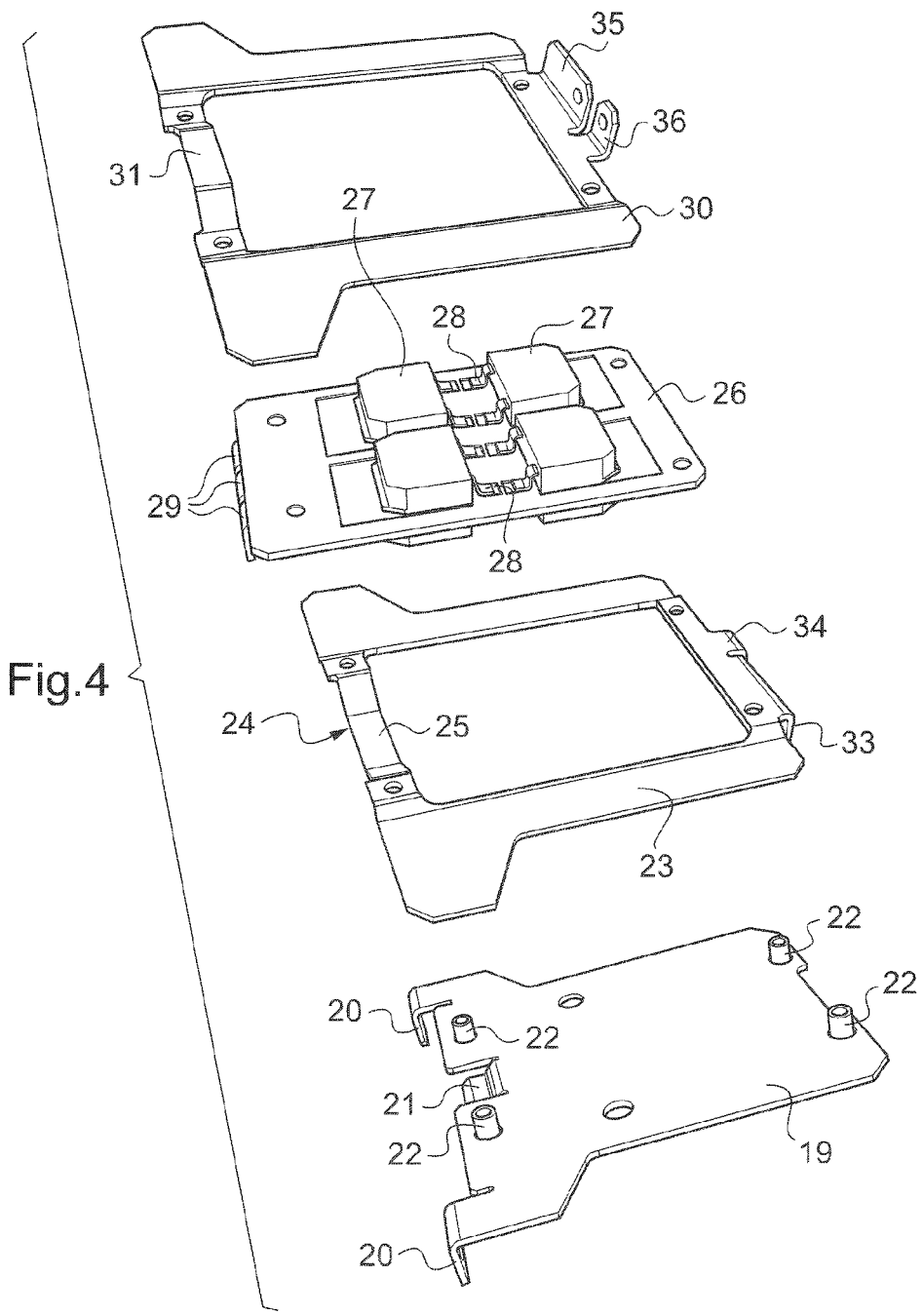
FIG. 4 is an exploded diagrammatic perspective view of a power module.

As can be seen in FIG. 4, the fastener tabs 20 of the support plate 19 are directed towards the outside of the module. As shown in FIG. 1, in which the intermediate plate 30 of the last power module is shown cut away, the intermediate plates 23 and 30 of one module mask the fastener tabs 20 of the preceding module.

This design of the intermediate plates 23 and 30 is such that putting an additional power module into place at the end of the electrical pack inhibits access to the fastener tab 20 of the previously-assembled power module. This makes it possible to provide keying during assembly of packs in the electrical housing 1 in order to ensure that every mounted pack has the right number of power modules.

In the assembled position, the component carrier plate 26 is sandwiched between the frame-shaped intermediate plates 23 and 30 that surround the power components on each of the faces of the component carrier plate 26 while being in contact with the component carrier plate 26 and with the corresponding support plates. Thus, the intermediate plates 23 and 30 receive the heat emitted by the power component 27 both by radiation and by conduction, and they diffuse this heat by conduction to the support plates and by convection into the stream of air that flows between the support plates, the intermediate plates, and the component carrier plates.

In order to increase transfers of heat, it is also possible to establish direct thermal contact between the power components 27 and the corresponding support plates.

The principle of the electrical pack makes it possible, merely by assembly, to configure at will as many power modules as are needed for a given control module. The control connections between the control module and the various power modules are provided either by connecting the modules together in parallel, or by connecting them together in series during successive engagements of the elements. It is thus possible while using only two different modules to build up an entire range of fully modular electrical packs.

Naturally, the invention is not limited to the embodiment described and embodiment variants may be provided without going beyond the ambit of the invention as defined by the claims.

In particular, although the invention is described with power modules having a component carrier plate sandwiched between intermediate plates, it is also possible to make power modules with component carrier plates extending perpendicularly to the support plates so as to provide longitudinal ducts that encourage convection movement even when the forced ventilation system of the electrical housing is faulty.

What is claimed is:

1. An electrical pack comprising: power components; and control components distributed in modules, wherein the power components are grouped together in at least one power module while the control components are grouped together in at least one control module that is separate from said at least one power module, and wherein the at least one control module includes a support plate made of a metal that is a good conductor of heat and that is associated with an electrically insulating component carrier plate carrying control components and electrical connection circuits, the component carrier plate being spaced apart from the support plate, the control module being protected by the support plate against heating coming from the at least one power module that is adjacent to the control module, wherein the at least one control module includes a perforated cover made of a metal that is a good conductor of heat having an edge surrounding the control component.

2. The electrical pack according to claim 1, wherein the at least one power module includes a support plate made of a metal that is a good conductor of heat and associated with another component carrier plate carrying power components and electrical connection circuits of the power components, the another component carrier plate being spaced apart from the support plate.

3. The electrical pack according to claim 2, wherein the at least one power module include intermediate plates in the form of frames made of a metal that is a good conductor of heat and providing a mechanical and thermal connection between the another component carrier plate and the adjacent support plates.

4. The electrical pack according to claim 3, wherein the intermediate plate surrounds the power components while being spaced apart therefrom.

5. The electrical pack according to claim 3, wherein the intermediate plate includes a portion in relief in direct contact with the adjacent support plate.

6. The electrical pack according to claim 5, wherein the another component carrier plate is sandwiched between two of said intermediate plates.

7. The electrical pack according to claim 1, comprising an assembly of a plurality of power modules adjacent to one another and associated with one of the at least one control module located at one end of the assembly.

8. The electrical pack according to claim 2, wherein the support plate of the power module is identical to the support plate of the control module.

9. The electrical pack according to claim 3, wherein the support plate of a power module includes fastener tabs that are arranged to be masked by the intermediate plates of a following module in an assembly of modules.

10. The electrical pack according to claim 1, comprising a plurality of identical power modules and one control module.

11. The electrical pack according to claim 1, comprising a set of power modules and a set of control modules that are disposed in a stack, in which a last module at one of the ends of the stack is one of the control modules.

12. The electrical pack according to claim 1, wherein the at least one control module does not directly contact said at least one power module.

13. An electrical pack comprising: power components; and control components distributed in modules, wherein the power components are grouped together in at least one power module while the control components are grouped together in at least one control module that is separate from said at least one power module, and wherein the at least one control module includes a support plate made of a metal that is a good conductor of heat and that is associated with an electrically insulating component carrier plate carrying control components and electrical connection circuits, the component carrier plate being spaced apart from the support plate, the control module being protected by the support plate against heating coming from the at least one power module that is adjacent to the control module, wherein the at least one control module includes a perforated cover made of a metal that is a good conductor of heat having an edge surrounding the control component, and wherein the perforated cover encloses the control component and has an outer surface with at least one tab serving to fasten it to the immediately adjacent power module.

* * * * *